United States Patent
Lee et al.

(10) Patent No.: US 7,619,243 B2
(45) Date of Patent: Nov. 17, 2009

(54) COLOR ORGANIC ELECTROLUMINESCENT DISPLAY AND METHOD FOR FABRICATING THE SAME

(75) Inventors: Yuh-Zheng Lee, Hsinchu Hsien (TW);
Ching-Ian Chao, Hsinchu Hsien (TW);
Hsuan-Ming Tsai, Hsinchu Hsien (TW);
Fu-Kang Cheng, Hsinchu Hsien (TW);
Jhih-Ping Lu, Hsinchu Hsien (TW);
Je-Ping Hu, Hsinchu Hsien (TW);
Kuo-Tong Lin, Hsinchu Hsien (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 545 days.

(21) Appl. No.: 11/296,419

(22) Filed: Dec. 8, 2005

(65) Prior Publication Data

US 2006/0237713 A1    Oct. 26, 2006

(30) Foreign Application Priority Data

Mar. 17, 2005   (TW) ............................... 94108138 A

(51) Int. Cl.
*H01L 29/08* (2006.01)
*H01L 35/24* (2006.01)
*H01L 51/00* (2006.01)

(52) U.S. Cl. .................. 257/40; 257/642; 257/E51.018
(58) Field of Classification Search ............ 257/40, 257/642, E51.018
See application file for complete search history.

(56) References Cited

U.S. PATENT DOCUMENTS

| 6,445,005 B1 * | 9/2002 | Yamazaki et al. ............. 257/72 |
| 6,555,840 B1 * | 4/2003 | Hudson et al. ................ 257/40 |
| 2003/0157244 A1 | 8/2003 | Kawase |

FOREIGN PATENT DOCUMENTS

EP          0 989 778 A1      3/2000

* cited by examiner

*Primary Examiner*—Asok K Sarkar
(74) *Attorney, Agent, or Firm*—Birch, Stewart, Kolasch & Birch, LLP

(57) ABSTRACT

A method of fabricating a color organic electroluminescent display involves forming cathode electrodes on a substrate, and forming a first organic semiconductor layer having an electron-injection transporting property on the cathode electrodes. Solutions containing organic light-emitting material that can dissolve portions of the first organic semiconductor layer are patterned on the first organic semiconductor layer. Then, a solvent in the solutions is removed to form regions having second organic semiconductor layers and mixed organic semiconductor layers, wherein the second organic semiconductor layers are formed on the first organic semiconductor layer and are mostly composed of the organic light-emitting material, and the mixed organic semiconductor layers, composed of the organic light-emitting material and material constituting the first organic semiconductor layer, are embedded in the first organic semiconductor layer. Anode electrodes are formed over the first and second organic semiconductor layers. The present invention also provides a color organic electroluminescent display.

11 Claims, 3 Drawing Sheets

COLOR ORGANIC ELECTROLUMINESCENT DISPLAY AND METHOD FOR FABRICATING THE SAME

FIELD OF THE INVENTION

The present invention relates to a method for fabricating a color organic electroluminescent display and particularly to a print patterning method for fabricating a color organic electroluminescent display, wherein the method forms organic light-emitting layers and does not need additional structures, such as bank structures. The present invention further relates to a color organic electroluminescent display fabricated by the method.

BACKGROUND OF THE INVENTION

Organic electroluminescent displays are becoming more important in various electronic products because they have advantages of thinness, low weight, low power consumption, easy manufacturing, and the capability of being formed on flexible substrates, thereby making them widely applicable. Organic electroluminescent device is generally composed of an anode electrode, a cathode electrode, and an organic light-emitting structure positioned between the anode and the cathode electrode, wherein the organic light-emitting structure may include hole-injection layers, hole transporting layers, organic light-emitting layers, electron transporting layers, electron-injection layers, and the like. Currently, methods for forming each layer of the organic light-emitting structure comprise: dry processes such as vacuum coating, organic vapor deposition and laser induced thermal imaging, etc., and wet processes such as spin coating, photolithography, and print patterning, etc., wherein it is preferable for forming the organic light-emitting layer by print patterning techniques in the wet processes due to its suitability for producing large size color displays. Print patterning technique can further reduce production costs by use of moving plates and printing equipment controlled by computers, wherein solution are patterned on predetermined regions according to requirements, obtaining the best material efficiency.

However, liquid is inclined to flow, and therefore it is not easy to form film layers of predetermined patterns for each pixel. To solve this problem, EP 0989,778A1 provides a positioned patterning method, as shown in FIG. 1. Banks 62 of polyimide are previously formed on the substrate 61 by photolithographic processes, and the surfaces of the banks 62 are treated with oxygen plasma and tetrafluoromethane ($CF_4$) plasma so as to form fluoro-repelling film 63 on the surfaces of the banks 62. Next, hole-injection layer 64 is formed in the regions defined by banks 62. Then, organic light-emitting materials 65, 66 and 67 for producing various colors of light are separately inkjet printed on the hole-injection layer 64 and in the banks 62 with inkjet printing equipment 68. Due to the fluoro-repelling film on the surface of banks 62, organic light-emitting materials 65, 66 and 67 can be stably positioned in the regions defined by banks 62. Although organic light-emitting material can be properly positioned in the predetermined regions by the bank structures and surface treatment with repelling films, the process reduces production efficiency and increases production costs because of these additional procedures. Furthermore, it will result in electrical current leakage because of film defects between the cathode and anode electrodes, if the print patterning equipment misses discharging ink on desired area.

For this reason, U.S. patent application publication 20030157244 discloses a patterning method for organic light-emitting material positioned without making banks. As shown in FIG. 2, first, a conductive electrode layer 72 is formed on a substrate 71. Then, an insulating layer 73 is formed on the electrode layer 72 by spin coating. Next, a solution containing light-emitting conjugated polymer is deposited on the insulating layer by a microdroplet patterning method, wherein solvent in the solution can also dissolve material constituting the insulating layer 73. By this method, the solution being patterned on the insulating layer 73 can also dissolve the insulating material underlying the solution and form solution 74 containing light-emitting conjugated polymer and insulating material. Finally, solvent in solution 74 is removed to form the organic light-emitting layer. Due to the property of the solution dissolving the insulating layer 73, the method can position organic light-emitting material at predetermined regions. However, in order to drive the organic light-emitting device, the organic light-emitting material must extend through the insulating layer 73 to contact the electrode layer 72, but the area of contact narrows at depth and the presence of more insulating material will reduce the conductivity of the organic light-emitting layer, thereby resulting in an increase in the operating voltage for the emitting elements.

Moreover, it is usually to use active-matrix technique in color organic electroluminescent display devices for good image quality and especially moving images. Present active-matrix techniques mainly include using low temperature polycrystal silicon thin film transistors or amorphous silicon thin film transistors as pixel switching elements. There are several problems in practice in using low temperature polycrystal silicon thin film transistors as pixel switching elements. Therefore, in the liquid crystal display field, use of amorphous silicon thin film transistors as pixel switching elements is widely employed, and the transistor elements thereof have better uniformity and the technique thereof is relatively well developed. In particular, because n-type amorphous silicon thin film transistors have better element properties, it is desirable to apply n-type amorphous silicon thin film transistors to color organic luminescent display devices.

Thus, it is would be particularly desirable to have a method to position organic light-emitting material in predetermined regions by print patterning without additional structures such as bank structures, repelling films, and the like, and employ n-type amorphous silicon thin film transistors as pixel switching elements in color organic luminescent displays.

SUMMARY OF THE INVENTION

The present invention is made in consideration of the above problems and it is an object of the invention to provide a method for fabricating a color organic electroluminescent display, wherein organic light-emitting material can be defined in predetermined regions without additional structures such as bank structures and the like.

Another object of the present invention is to provide a color organic electroluminescent display fabricated by the method that uses n-type amorphous silicon thin film transistors as pixel switching elements so as to obtain better display quality.

Still another object of the present invention is to provide a color organic electroluminescent display that does not form short circuits between the anode and cathode electrodes, even if there are inkjet printed defects of organic light-emitting layers in some pixels during the fabrication of the display.

To achieve the above and other objectives, the present invention proposes an organic electroluminescent display comprising: a substrate; a plurality of cathode electrodes patterned on the substrate and arranged as pixels; a first organic semiconductor layer having an electron-injection transporting property disposed on the plurality of cathode electrodes; a plurality of mixed organic semiconductor layers respectively corresponding in position to the plurality of cathode electrodes, formed in the first organic semiconductor layer, wherein upper surfaces of the plurality of mixed organic semiconductor layers are respectively exposed over the first organic semiconductor layer; a plurality of second organic semiconductor layers respectively corresponding in position to the plurality of mixed organic semiconductor layers, formed on the first organic semiconductor layer, wherein the plurality of second organic semiconductor layers are respectively positioned on the plurality of mixed organic semiconductor layers; and common anode electrodes formed over the plurality of second organic semiconductor layers and the first organic semiconductor layer. Moreover, the plurality of mixed organic semiconductor layers are respectively made of organic semiconductor material from the corresponding second organic semiconductor layers and the organic semiconductor material from the first organic semiconductor layer.

Additionally, the color organic electroluminescent display of the present invention further includes a plurality of switching elements, respectively electrically connected to each of the corresponding cathode electrodes of organic light-emitting pixels, controlling current flowing to or voltage applied to each of the corresponding pixels. Preferably, the switching elements are n-type thin film transistors and their drain electrodes are respectively electrically connected to each of the corresponding cathode electrodes of organic light-emitting pixels. Because n-type amorphous silicon thin film transistors have better uniformity and the organic light-emitting structure of the present invention is an inverted structure, in which the organic semiconductor layer with electron-injection transporting properties is deposited on the cathode electrodes, the organic electroluminescent display of the present invention can have better display quality.

In the color organic electroluminescent display of the present invention, preferably, the plurality of mixed organic semiconductor layers and each of the corresponding cathode electrodes are respectively separated apart by at least portions of the first organic semiconductor layer, so as to have higher light-emitting efficiency. In addition, it is preferable to further form hole-injection transporting layers over the first organic semiconductor layer and the plurality of second organic semiconductor layers prior to the anode electrodes to further improve light-emitting efficiency.

In the color organic electroluminescent display of the present invention, it is preferable to deposit the first organic semiconductor layer on the plurality of cathode electrodes, such as depositing by spin coating or vacuum coating, such that the process efficiency can be increased and production costs can be reduced due to getting rid of masks and photolithographic processes.

In the color organic electroluminescent display of the present invention, preferably, the first organic semiconductor layer is composed of organic electron-injection transporting material or organic n-type doped material, and it is preferable that organic light-emitting materials are either conjugated polymers, conjuagted polymer doped with small molecular material, or a mixture thereof.

Another aspect of the present invention provides a method for fabricating a color organic electroluminescent display, comprising steps of: preparing a substrate; patterning a plurality of cathode electrodes in pixel arrangement on the substrate; forming a first organic semiconductor layer, having the electron-injection transporting property, on the plurality of cathode electrodes; respectively patterning a plurality of solutions, respectively corresponding to the organic light-emitting material of different colors in which the used solvents can dissolve or partially dissolve the material constituting the first organic semiconductor layer, on a plurality of predetermined regions of the first organic semiconductor layer, wherein the plurality of predetermined regions are respectively corresponding to patterned positions of the plurality of the cathode electrodes, wherein, by utilizing a property of the solvent in which it is capable of dissolving or partially dissolving the material constituting the first organic semiconductor layer, one portion of the solutions, which has been patterned on the predetermined regions, is respectively absorbed and then partially dissolves the first organic semiconductor layer; removing the solvent in the portion of the solutions absorbed into and partially dissolving the organic semiconductor layer to form a plurality of mixed organic semiconductor layers, and to form a plurality of second organic semiconductor layers from the other portion of the solution; and forming a common anode electrode over the first organic semiconductor layer and the second organic semiconductor layers, wherein, the plurality of mixed organic semiconductor layers are respectively made of the second organic semiconductor materials, respectively corresponding to different colors, and the material constituting the first organic semiconductor layer.

Because the solution containing the organic light-emitting materials can be absorbed by and dissolve the first organic semiconductor layer, the solution is positioned in predetermined regions and will not overflow elsewhere since the solution is absorbed when the solution is patterned by printing or a droplet-forming technique on the first organic semiconductor layer. Thus, organic light-emitting layers can be positioned in predetermined regions even if there is no bank structure and repelling film.

The fabricating steps of the color organic electroluminescent display in the present invention further comprise: forming a hole-injection transporting layer over the first organic semiconductor layer and the plurality of second organic semiconductor layers before forming the anode electrode. Accordingly, the light-emitting efficiency of the present elements can be further improved.

In the fabricating method of the color organic electroluminescent display of the present invention, the solution, which contains the organic light-emitting materials and can be absorbed by and dissolve the first organic semiconductor layer, and it can be patterned on the first organic semiconductor layer by printing. Optionally, the solution, which contains the organic light-emitting materials which can be absorbed by and dissolve the organic semiconductor layer, can be patterned on the first organic semiconductor layer by droplets. Accordingly, display with large area can be formed. In the method of fabricating the color organic electroluminescent display of the present invention, a plurality of switching elements may be formed before forming the plurality of cathode electrodes of organic light-emitting pixels, to respectively electrically connected to each of the corresponding cathode electrodes, so as to control the applied voltage and current flow. Preferably, the switching elements are n-type thin film transistors and respectively electrically connect the drain electrodes thereof to each of the corresponding cathode electrodes of organic light-emitting pixels.

Due to the organic semiconductor layer having the electron-injection transporting property, and that the cathode electrodes are electrically connected to the drain electrodes of n-type thin film transistors as pixel switching elements, the resulting organic light-emitting display can be more uniformly drived.

Accordingly, because the present invention utilizes the property of being absorbed by and dissolving the first organic semiconductor layer and that the organic light-emitting solution can be positioned to form second organic semiconductor layers and mixed organic semiconductor layers, it can define organic light-emitting materials in predetermined regions without additional structures such as bank structures. In addition, due to forming a common first organic semiconductor layer, it does not result in short circuits between the cathode and anode electrodes, even if some pixels are not deposited by organic light-emitting materials during the process of patterning organic light-emitting materials by printing or by microdroplet patterning.

DETAILED DESCRIPTION OF THE PREFERRED EMBODIMENTS

First Preferred Embodiment

FIGS. 3A to 3E schematically show the steps for fabricating a color organic electroluminescent display in accordance with a first preferred embodiment of the present invention.

Figure 1:
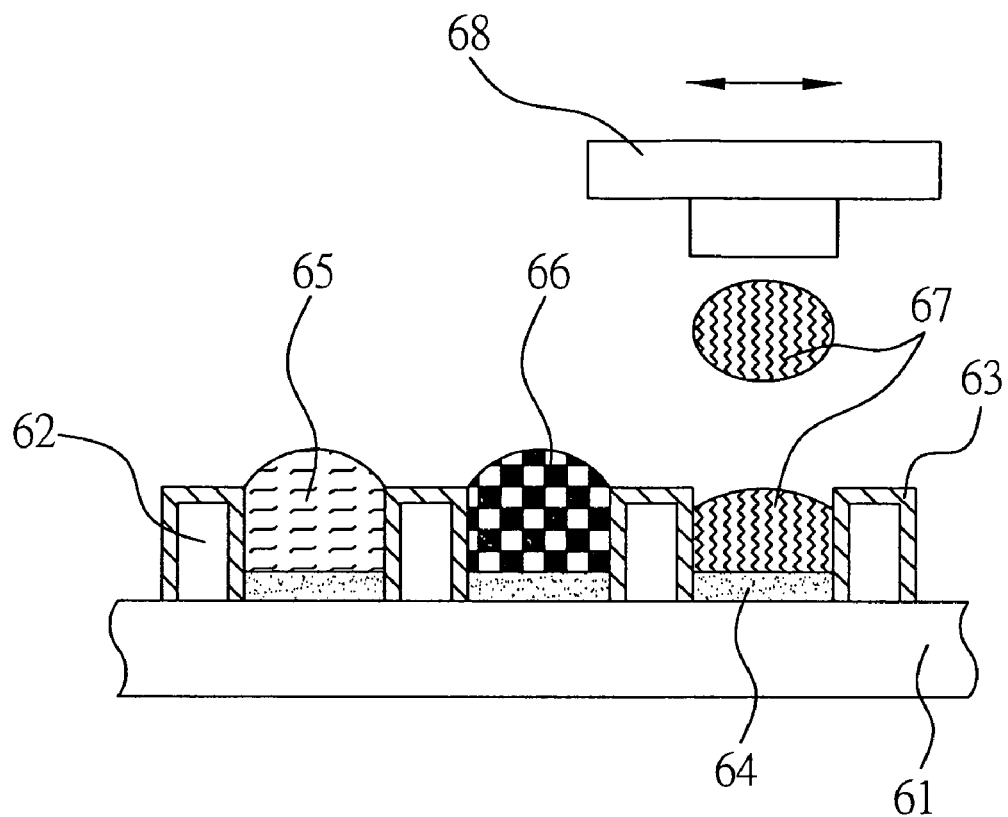
FIG. 1 (PRIOR ART) is a schematic diagram showing a conventional microdroplet print patterning method for a color organic electroluminescent display.
Figure 2:
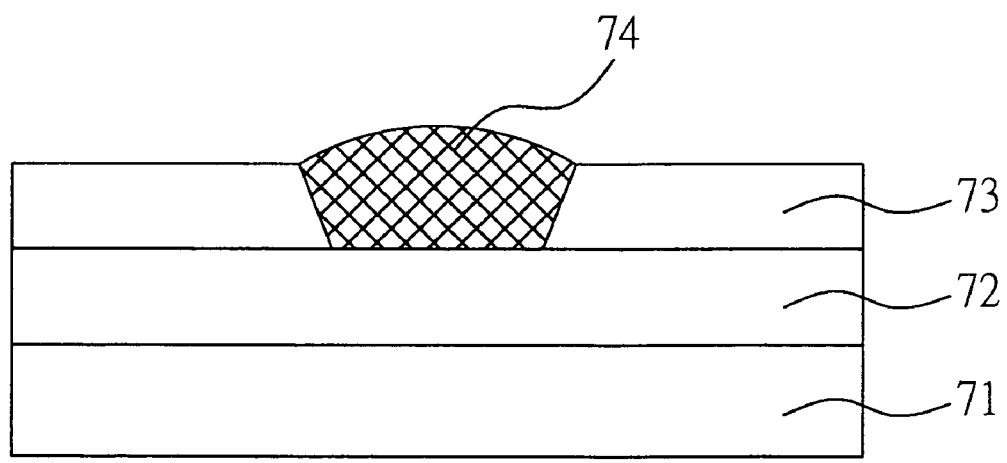
FIG. 2 (PRIOR ART) is a schematic diagram showing another conventional microdroplet print pattering method for a color organic electroluminescent display.
Figure 3A:
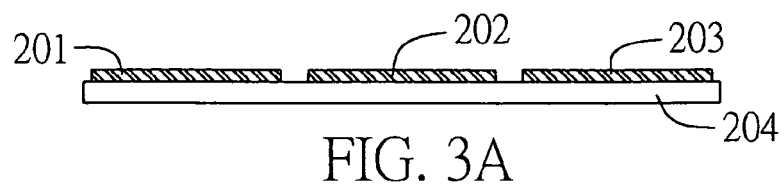
FIGS. 3A to 3E are schematic diagrams showing the steps of fabricating a color organic electroluminescent display in accordance with a first preferred embodiment of the present invention.
Figure 3B:
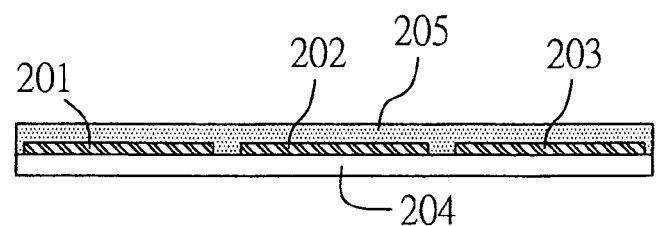

Referring to FIG. 3A, the fabrication method of the color organic electroluminescent display in the first embodiment of the present invention is depicted, wherein, first, a substrate 204 is prepared. The substrate 204, depending on requirements of the design, may be a transparent substrate such as a non-alkaline glass substrate, transparent plastic substrate, and the like, or it may be an opaque substrate such as a reflective film coated substrate, metal substrate, and the like. Then, a plurality of cathode electrodes 201, 202 and 203, which are patterned in pixel arrangements, are formed on the substrate 204 by known processes, such as the lithographic process, and so on. The cathode electrodes 201, 202, and 203 are formed for the purpose of respectively corresponding with pixels emitting different color light in the color organic electroluminescent display. Furthermore, the cathode electrodes 201, 202 and 203 are made of, but not limited to, stable materials, such as indium tin oxide (ITO), Ag, Al, or alloys thereof. Next, referring to FIG. 3B, a first organic semiconductor layer 205 is deposited on the cathode electrodes 201, 202 and 203 by conventional processes, e.g. spin coating or vapor deposition, in order to cover the cathode electrodes 201, 202 and 203. The first organic semicondutor layer is composed of materials having the electron-injection transporting property, for example, organic electron-injection transporting materials or organic n-type doped materials, and can be, for example, a stacking composition of cesium carbonate ($Cs_2CO_3$) and bis(2-methyl-8-quinolinolato)(para-phenylphenolato aluminum)(BAlq), a mixture of cesium carbonate with BAlq, a stacking composition of cesium carbonate and a mixture of polyfluorenes and 2,9-dimethyl-4,7-diphenyl-1,10-phenanthroline(BCP). In addition, the thickness of the first organic semiconductor layer ranges from 30-80 nm.

Figure 3C:
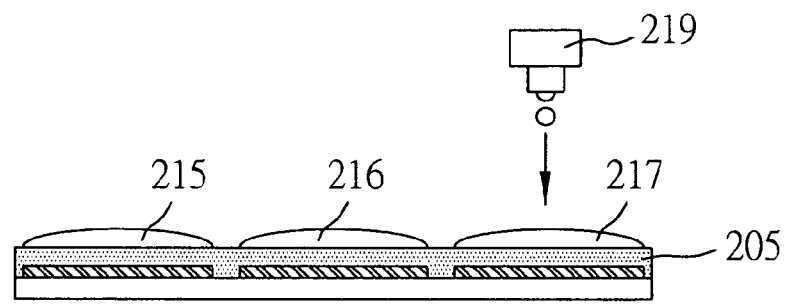

Next, referring to FIG. 3C, organic light-emitting solutions, each containing a solution respectively corresponding to red light (abbr. R), green light (abbr. G), and blue light (abbr. B), are patterned in predetermined regions (i.e. respectively corresponding to the regions of the cathode electrodes 201, 202 and 203) on the first organic semiconductor layer 205 by microdroplet discharging equipment 219, thus forming the organic light-emitting solution droplets 215, 216 and 217, respectively corresponding to R, G, and B on the first organic semiconductor layer 205. The organic light-emitting solution droplets 215, 216 and 217 contain respective organic light-emitting materials, which are respectively corresponding to R, G, and B, and slovent, which can dissolve or partially dissolve the first organic semiconductor layer 205, thus having the effects of being absorbed by and dissolving the first organic semiconductor layer 205. Preferably, the organic light-emitting material is any one of light-emitting conjugated polymer, a doped substance of conjugated polymer and small molecular material, or a mixture thereof.

Figure 3D:
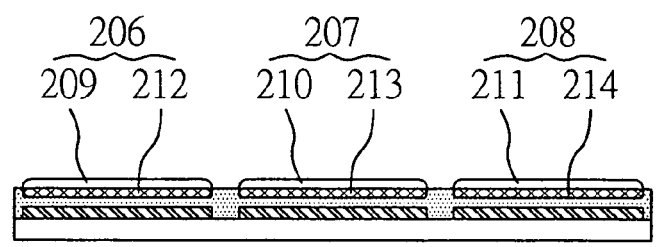

Next, referring to FIG. 3D, by virtue of the effects described above, portions of droplets 215, 216, and 217, containing solutions respectively corresponding to R, G, and B organic light-emitting materials, are absorbed by and dissolve the first organic semiconductor layer 205. Then, solvent in droplets 215, 216 and 217 are removed to form organic light-emitting layers 206, 207 and 208, which are respectively corresponding to R, G, and B, wherein, organic light-emitting layer 206, corresponding to R, has a second organic semiconductor layer 209 and a mixed organic semiconductor layer 212; organic light-emitting layer 207, corresponding to G, has a second organic semiconductor layer 210 and a mixed organic semiconductor layer 213; organic light-emitting layer 208, corresponding to B, has a second organic semiconductor layer 211 and a mixed organic semiconductor layer 214. Second organic semiconductor layers 209, 210, and 211 are respectively formed on the first organic semiconductor layer 205, and substaintially constituted by organic light-emitting materials, respectively corresponding to R, G, and B. The mixed organic semiconductor layers 212, 213 and 214 are embedded in the first organic semiconductor layer 205, i.e., the mixed organic semiconductor layers 212, 213 and 214 are respectively formed in the first organic semiconductor layer 205, and the upper surface of the mixed organic semiconductor layer 212, 213, and 214 are respectively positioned under the second organic semiconductor layers. The mixed organic semiconductor layers 212, 213 and 214 are respectively made of organic light-emitting materials, respectively corresponding to R, G, and B, and the material constituting the first organic semiconductor layer 205. In addition, the lower surface of the second organic semiconductor layer 209, 210 and 211 are respectively contact with the upper suface of the mixed organic semiconductor layers 212, 213, and 214, i.e., the second organic semiconductor layers 209, 210 and 211 are respectively formed on the mixed organic semiconductor layers 212, 213 and 214.

Figure 3E:
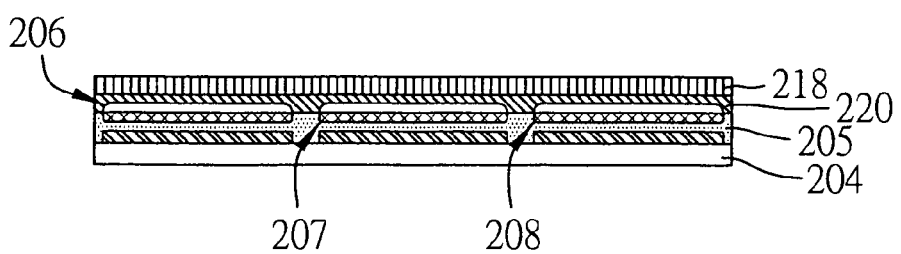

Finally, referring to FIG. 3E, p-type hole-injection transporting layer 220 is formed over the first organic semicondutor layer 205 and the organic light-emitting layers 206, 207 and 208 by a method, e.g., thermal evaporation deposition or spin coating. The hole-injection transporting layer 220 is, for example, a mixture of ferric chloride ($FeCl_3$) and NPB, and its thickness is from 30 nm to 80 nm. Then, common anode electrode 218 with a thickness such as 100 nm is formed on the hole-injection transporting layer 220, and the color organic electroluminescent display in the first embodiment of the present invention is achieved.

Accordingly, different currents and voltages can be applied between cathode electrodes 201, 202 and 203, and the common anode electrode 218, to drive each organic light-emitting device containing the first organic semiconductor layer 205 and organic light-emitting layers 206, 207 and 208, respectively, to respectively emit different brightnesses of red, green and blue light, such that color patterns are formed on the display. Particularly, it is preferable that the color organic electroluminescent display of the present invention is a full color or multicolor display capable of displaying full color or multicolor.

Preferably, mixed organic semiconductor layers 212, 213 and 214 of the organic light-emitting layers 206, 207 and 208 in the color organic electroluminescent display of the present invention are respectively separarted at least a portion of the thickness of the first organic semicondutor layer 205 from cathode electrodes 201, 202 and 203, so as to have higher emitting efficiency. Moreover, an additional hole transporting/electron blocking layer may also be formed after forming organic semiconductor layer 205 and the organic light-emitting layers 206, 207 and 208, and before forming hole-injection transporting layer 220, in order to have more emitting efficiency.

In order to achieve an active-matrix type of color organic electroluminescent display of the first embodiment of the present invention, it is preferable that conventional switching elements (not shown), e.g. n-type film transistors, respectively corresponding to cathode electordes 201, 202 and 203, are formed by known techniques, and drain electrodes thereof are respectively electrically connected to the corresponding cathode electrodes 201 or 202 or 203 to control the driving current or votlage intensity.

In the above illustration of this embodiment, organic light-emitting layers are patterned by microdroplet equipment 219, but the persent invention is not limited to this technique; the organic light-emitting layers can also be patterned by printing equipment, and the principles are the same as this embodiment.

In addition, although the color organic electroluminscent display in the first embodiment of the present invention does not utilize a bank structure and repelling film to define the organic light-emitting layer, this absence is not a requirement of the present invention, and bank structures may also be formed previously between predetermined regions of the organic light-emitting layers 206, 207 and 208, and repelling film on surface of each bank struture may also be formed, so as to have better control over element positioning.

Moreover, after completing the color organic electroluminescent display of the first embodiment of the present invention, hermetic sealing method may further be applied to the display in accordance with conventional techniques. Because these processes are well known in electroluminescent display devices, they are not further disscussed herein.

Second Preferred Embodiment

FIGS. 4A to 4E schematically show the steps of fabricating a color organic electroluminescent display in accordance with a second preferred embodiment of the present invention. The second embodiment of the present invention is a variation of the first embodiment, so the descriptions for the same structures and functions are not repeated. In FIGS. 4A to 4E, matching reference numerals denote corresponding structures with FIG. 3A to 3E.

Figure 4A:
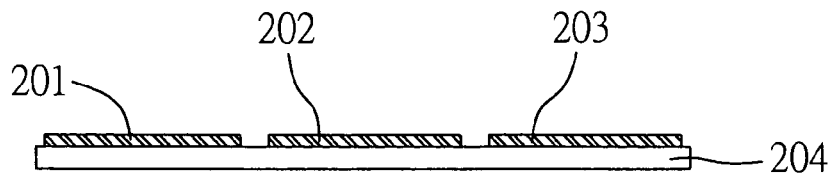
FIGS. 4A to 4E are schematic diagrams showing the steps of fabricating a color organic electroluminescent display in accordance with a second preferred embodiment of the present invention.

First, referring to FIG. 4A, the fabrication method of the color organic electroluminescent display in the second embodiment of the present invention also includes preparation of one substrate 204, upon which a plurality of cathode electrodes 201, 202 and 203 are patterned. The cathode electrodes 201, 202, and 203 are formed for the purpose of respectively corresponding with pixels emitting different colors of light in the color organic electroluminescent display.

Figure 4B:
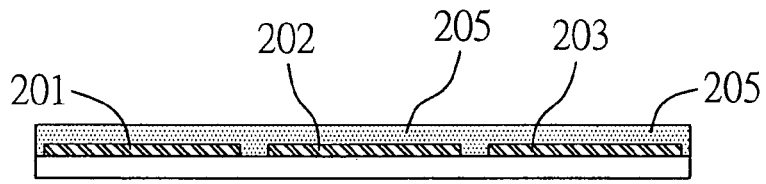

Next, referring to FIG. 4B, a common first organic semiconductor layer 205 is deposited on the cathode electrodes 201, 202 and 203, in order to cover the cathode electrodes 201, 202 and 203.

Figure 4C:
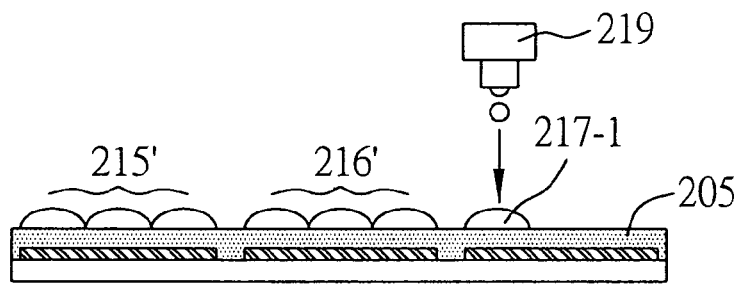

Sequentially, referring to FIG. 4C, organic light-emitting solutions, which contains solutions respectively corresponding to red light (abbr. R), green light (abbr. G) and blue light (abbr. B), are patterned in predetermined regions (i.e. respectively corresponding to the regions of cathode electrodes 201, 202 and 203) on the first organic semiconductor layer 205 by the multi-spot patterning method, thus organic light-emitting droplets 215' are corresponding to red light and contain a plurality of organic light-emitting droplets; organic light-emitting droplets 216' are corresponding to green light and contain a plurality of organic light-emitting droplets; and organic light-emitting droplets 217' are corresponding to blue light and contain a plurality of organic light-emitting droplets. The organic light-emitting droplets 215', 216' and 217' contain respective organic light-emitting materials, which are respectively corresponding to R, G and B, and a solvent, which can dissolve or partially dissolve the first organic semiconductor layer 205, wherein the solvent-containing solutions are first absorbed and then partially dissolve the first organic semiconductor layer 205. In this embodiment, although each pixel is patterned by three droplets, such patterning is not a limitation, and the patterning can also pattern a different number of droplets depending on the size of pixels and demands of the design. In addition, as shown in FIG. 4C, in this embodiment, a plurality of droplets are patterned in pixels by a multi-spot method, and each adjacent droplet is not overlapped, so that the following organic light-emitting layers have more uniform thickness. But the invention is not limited to this method; droplets can also be patterned in rows, wherein no overlap exists between rows.

Figure 4D:
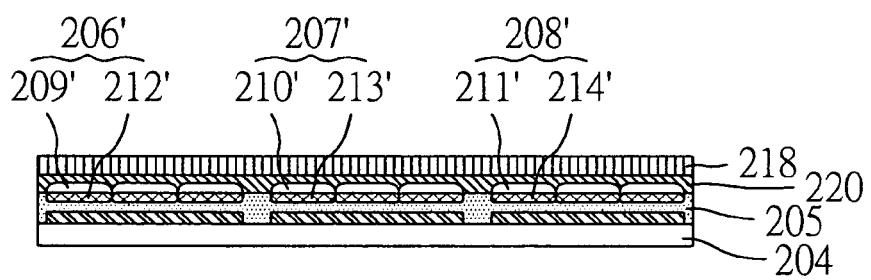

Then, referring to FIG. 4D, using the above-described property wherein the solutions are first absorbed by and the partially dissolve the first organic semiconductor layer 205, portions of droplets 215', 216' and 217', containing organic light-emitting materials respectively corresponding to R, G and B, are absorbed by and then partially dissolve the first organic semiconductor layer 205. Then, solvent in the droplets 215', 216' and 217' is removed to form organic light-emitting layers 206', 207' and 208', which are respectively corresponding to R, G and B.

Organic light-emitting layer 206', corresponding to R, has second organic semiconductor layer 209', containg a plurality of second organic semiconductor regions, and mixed organic semiconductor layer 212', containing a plurality of mixed organic semiconductor regions; organic light-emitting layer 207', corresponding to G, has second organic semiconductor layer 210', containg a plurality of second organic semiconductor regions, and mixed organic semiconductor layer 213', containing a plurality of mixed organic semiconductor regions; and organic light-emitting layer 208', corresponding to B, has second organic semiconductor layer 211', containg a plurality of second organic semiconductor regions, and mixed organic semiconductor layer 214', containing a plurality of mixed organic semiconductor regions. Second organic semiconductor layers 209', 210' and 211' are respectively formed on the first organic semiconductor layer 205, and substaintially constituted by organic light-emitting materials, respectively corresponding to R, G and B. The mixed organic semiconductor layers 212', 213' and 214' are embedded in the first organic semiconductor layer 205, and are made of organic light-emitting materials, respectively corresponding to R, G and B, and material constituting the first organic semiconductor layer 205.

Figure 4E:
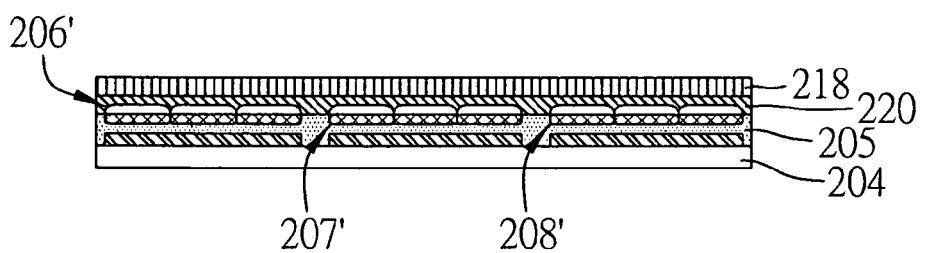

Finally, referring to FIG. 4E, p-type hole-injection transporting layer 220 is formed over the first organic semicondutor layer 205 and the organic light-emitting layers 206', 207' and 208', and then a common anode electrode 218 is formed on the hole-injection transporting layer 220 with a thickness of, for example, 100 nm, thus completing the color organic electroluminescent display of the second embodiment of the present invention.

Accordingly, by the above multi-spot patterning method, a more uniform thickness of the organic light-emitting layers within pixels having larger area can be obtained, and it can be patched for missing dots without affecting the film pattern of other ink dots, as there are sometimes missing dots in an inkjet printing process.

The above disclosure is merely to illustrate features and effects of the present invention, and it is not intended to limit the present invention; therefore, upon consideration of this disclosure, many equivalent versions employing changes, modifications, and variations can be employed without departing from the spirit and scope of the present invention, and such equivalents are intended to be encompassed by the following claims.

What is claimed is:

1. A color organic electroluminescent display, comprising:
   a substrate;
   a plurality of cathode electrodes formed on the substrate and arranged as pixels;
   a first organic semiconductor layer having an electron-injection transporting property and disposed on the plurality of cathode electrodes;
   a plurality of mixed organic semiconductor layers respectively corresponding in position to the plurality of cathode electrodes, formed in the first organic, semiconductor layer, wherein upper surfaces of the plurality of mixed organic semiconductor layers are respectively exposed from the first organic semiconductor layer;
   a plurality of second organic semiconductor layers respectively corresponding in position to the plurality of mixed organic semiconductor layers, formed on the first organic semiconductor layer, wherein the plurality of second organic semiconductor layers are respectively positioned on the plurality of mixed organic semiconductor layers; and
   a common anode electrode formed over the plurality of second organic semiconductor layers and the first organic semiconductor layer,
   wherein the plurality of mixed organic semiconductor layers are respectively made of a mixture of organic light-emitting material constituting each of the corresponding second organic semiconductor layers and material constituting the first organic semiconductor layer, and
   wherein lower surfaces of the second organic semiconductor layer (209, 210, 211) are respectively in contact with the upper surfaces of the mixed organic semiconductor layers (212, 213, 214), and each of the mixed organic semiconductor layers is spaced from each other.

2. The color organic electroluminescent display of claim 1, wherein the plurality of mixed organic semiconductor layers and the corresponding cathode electrodes are respectively separated apart by at least a portion of the first organic semiconductor layer.

3. The color organic electroluminescent display of claim 1, wherein the material constituting the first organic semiconductor layer includes organic electron-injection transporting material or n-type doped organic material.

4. The color organic electroluminescent display of claim 1, wherein the first organic semiconductor layer is commonly formed on the plurality of cathode electrodes.

5. The color organic electroluminescent display of claim 1, wherein the organic light-emitting material is one of conjugated polymer material, doped substance of conjugated polymer and small molecular material, and a mixture thereof, having a light-emitting property.

6. The color organic electroluminescent display of claim 1, further comprising a hole-injection transporting layer formed over the first organic semiconductor layer and the plurality of second organic semiconductor layers and under the anode electrode.

7. The color organic electroluminescent display of claim 1, further comprising a plurality of switching elements respectively electrically connected to the cathode electrodes, for controlling current flowing through or voltage applied to the cathode electrodes.

8. The color organic electroluminescent display of claim 7, wherein the switching elements are n-type thin film transistors and respectively electrically connect drain electrodes thereof to the cathode electrodes.

9. The color organic electroluminescent display of claim 1, wherein bank structures are further formed on a part of the first organic semiconductor layer, adjacent to the plurality of cathode electrodes, to define regions for forming the mixed organic semiconductor layers and the second organic semiconductor layers.

10. The color organic electroluminescent display of claim 9, wherein a repelling film is formed on each of the bank structures.

11. The color organic electroluminescent display of claim 1, wherein the color organic electroluminescent display is a full color display or a multi-color display.

* * * * *